United States Patent

Teramoto et al.

[15] 3,675,161

[45] July 4, 1972

[54] VARACTOR-CONTROLLED PN JUNCTION SEMICONDUCTOR MICROWAVE OSCILLATION DEVICE

[72] Inventors: Iwao Teramoto, Ibaragi-shi; Hitoo Iwasa, Takatsuki-shi; Yukio Miyai, Osaka; Masumi Takeshima, Takatsuki-shi, all of Japan

[73] Assignee: Matsushita Electronics Corporation, Osaka, Japan

[22] Filed: Oct. 8, 1969

[21] Appl. No.: 864,684

[30] Foreign Application Priority Data

Oct. 12, 1968 Japan....................................43/74739

[52] U.S. Cl. ..............................332/16 R, 307/302, 307/303, 307/320, 317/234 UA, 317/235 AK, 317/235 K, 317/235 T, 331/107 R, 332/30 V

[51] Int. Cl...............................................................H03c 3/22

[58] Field of Search.......................332/29, 30, 30 V, 16, 16 T; 331/107, 107 T, 107 G; 307/302, 303, 320, 318; 317/239, 234, 47.1, 234 AK, 234 UA, 234 K, 234 T; 328/16; 321/69

[56] References Cited

UNITED STATES PATENTS

| | | | |
|---|---|---|---|
| 3,141,141 | 7/1964 | Sharpless | 331/107 T |
| 3,403,306 | 9/1968 | Haitz et al. | 307/302 X |
| 3,465,265 | 9/1969 | Kuru | 331/36 C X |
| 3,524,149 | 8/1970 | Socci | 307/318 X |
| 3,518,574 | 6/1970 | Rutz | 332/7.51 |

OTHER PUBLICATIONS

Fleming, " Electronic FM Modulation of GaAs Oscillator" Vol. 8, No. 8, Jan. 1966, p. 1,077 107G Eastman " Gunn Effect Device with Control Electrode" RCA TN No. 756, Apr. 1968

Brehm et al., " Varactor-Tuned Integrated Gunn Oscillators" IEEE Jour. of Solid State Ckts. Sc. 3, No. 3, September 1968 pp. 217- 220

Lee et al., " Frequency Modulation of Millimeter-wave IMPATT Diode Oscillator and Related Harmonic Generation Effects" Bell System Technical Journal, January 1969, p. 143-161

*Primary Examiner*—Alfred L. Brody
*Attorney*—Stevens, Davis, Miller & Mosher

[57] ABSTRACT

A solid state microwave generating device comprising a 3-terminal element having a p-n junction representing a negative resistance and a junction of which the junction capacitance is varied according to a voltage applied thereto. A reverse voltage is imparted to said p-n junction so that the latter is maintained in a negative resistance condition resulting from an avalanche current. The other junction is set to a suitable reactance value so as to produce a microwave of a tuned wavelength, and under such a condition a modulating signal is supplied in superimposition to said other junction to thereby change the reactance value thereof, thus effecting microwave modulation. With this device, the oscillation wave occurring in a resonator circuit is controlled in accordance with lumped constants so that the tuning operation of the resonant circuit, modulation (FM), automatic frequency control (AFC) and so forth can be easily and efficiently performed.

10 Claims, 4 Drawing Figures

I. TERAMOTO,
H. IWASA,
Y. MIYAI &
M. TAKESHIMA
INVENTORS

BY Stevens, Davis, Miller & Mosher
ATTORNEY

VARACTOR-CONTROLLED PN JUNCTION SEMICONDUCTOR MICROWAVE OSCILLATION DEVICE

This invention relates to a microwave generating device, and more particularly it pertains to a device wherein the oscillation frequency can be controlled.

As solid state microwave oscillating devices, there have been proposed, following discovery of the Gunn effect which occurs in a semiconductor, various junction type semiconductor oscillating elements including as basic constituents p-n junctions.

In all such conventional microwave oscillating semiconductor elements, however, the external electrodes are provided as two terminals so that only the current density in the element is variable. Therefore, difficulty has been encountered in achieving frequency control such as tuning, modulation or the like by the element per se. More specifically, in the case of an oscillator device using a solid state microwave oscillating element as the electromagnetic wave generating element, the oscillating element, which is usually provided in a cavity resonator, is previously maintained under a predetermined oscillating condition. Frequency control is effected by mechanical means such as a movable shorting plate, called a shorting piston, provided at one end of the cavity resonator or by attaining a tuned state with the aid of a tuning device called an EH tuner provided on a waveguide.

In the case of an element wherein the oscillation frequency depends upon a current supplied thereto such as a microwave oscillator diode using a p-n junction called an avalanche diode, a controlling method utilizing this characteristic has been adopted. With this method, however, since the dependence of the frequency variation upon the current is not uniform, it is very difficult to achieve the desired control. In addition, the element per se tends to be destroyed due to a runaway-current phenomenon which occur under certain conditions of temperature and frequency.

Incidentally, there is a well known microwave modulation system wherein a variable reactance element such as a variable capacitance diode or the like is inserted in a transmission circuit system, and amplitude modulation is effected by utilizing the so-called filter effect of this element. With this system, however, not only is the loss of the transmission circuit increased but it is also essential that the noise of a modulating signal be severely limited. Thus, this system is limited to a narrow bandwidth, and therefore technical difficulty is encountered in applications thereof.

It is an object of the present invention to provide a device using a solid state microwave oscillating element as an electromagnetic wave generating source and which is so designed that frequency control can be easily effected.

The microwave generating device according to the present inVention is characterized in that the solid state microwave generating element provided in a cavity resonator includes at least two p-n junctions formed in a semiconductor body, or at least one or more p-n junctions and one Schottky barrier, or one sandwich structure of a metal-insulator-semiconductor. Said p-n junctions are associated with voltage applying means for applying reverse voltages thereto respectively, one of said p-n junctions being made to represent a negative resistance by being provided with a bias voltage in excess of the breakdown voltage thereof, and the other p-n junction being provided with a zero or reverse bias voltage so that the junction capacitance thereof is varied. In other words, the present invention is intended to provide a 3-terminal solid state microwave generating device including control electrodes. With the device of this invention, the problems with the conventional solid state microwave oscillating elements can be completely solved.

Other objects, features and advantages of the present invention will become apparent from the following description taken in conjunction with the accompanying drawings, in which.

Figure 1:
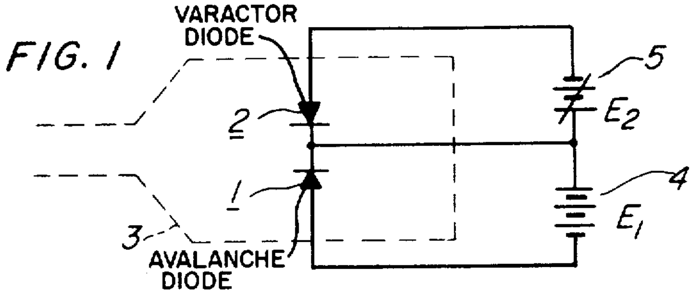
FIG. 1 is a schematic diagram illustrating the principle of the device according to the present invention.

Referring to FIG. 1, a solid state oscillator element consisting of a first p-n junction 1 and a second p-n junction 2 is provided in a cavity resonator 3, with the junctions 1 and 2 connected across voltage applying means 4 and 5 ($E_1$ and $E_2$) respectively so that reverse bias voltages are applied thereto.

The first p-n junction 1 is adapted to present a negative resistance when a reverse bias voltage in excess of the breakdown voltage is applied thereto by the voltage applying means 4. The second p-n junction 2 is adapted so that the junction capacitance thereof is varied when zero or negative bias is imparted thereto by the voltage applying means 5. Thus, a predetermined microwave oscillation is produced with the aid of such two p-n junctions. The inventors have found that the oscillation characteristics of a microwave solid state oscillator element depend largely upon a reactance present in the neighborhood of the element. Particularly, it has been found that in the case where an oscillator element (avalanche diode) and a variable capacitance diode (varactor) are disposed adjacent to each other in the same cavity resonator, the oscillation frequency can be greatly changed by controlling the bias imparted to the variable capacitance diode. The aforementioned experimental result shows that a resonant circuit is constituted by the oscillator element and reactance element, wherein the resonant circuit constants can be controlled by a lumped-constant element serving as a variable reactance element, at a distance corresponding to one-fourth or less of the wavelength of the microwave oscillation.

With the device of the present invention, the tuning operation of the resonant circuit can be electrically easily and efficiently performed, so that modulation (FM) and automatic frequency control (AFC) can be greatly facilitated.

Figure 2:
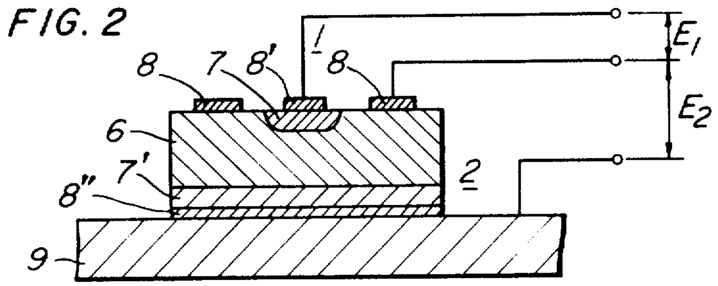
FIGS. 2 and 3 are schematic sectional views showing the solid state elements of the devices according to embodiments of the present invention respectively.

FIG. 2 shows a solid state microwave generating device of the present invention, wherein two p-n junctions are electrically connected in series with each other. First and second p-n junctions 1 and 2 shown in FIG. 2 correspond to those of FIG. 1 respectively. In FIG. 2, numeral 6 represents a P-type germanium substrate for example, 7, 7′ n type layers formed on the substrate by a diffusion technique, 8, 8′, 8″ metal electrodes constituting an ohmic contact with P- and N-type layers, and 9 a heat dissipating metal plate or heat sink. In this device, the junction 1 is used as a negative resistance element to which a voltage $E_1$ in excess of the breakdown voltage is applied for causing an avalanche current to flow through the p-n junction so as to produce a negative resistance value, and a DC reverse bias voltage $E_2$ is imparted to the junction 2 to change the static capacitance of this p-n junction so that a desired oscillation frequency output can be provided by said device.

The device having two p-n junctions thus connected in series with each other can easily change the impedance of the oscillating element provided in the cavity resonator.

The inventors have prepared such solid state oscillating element in such a manner that a silicon dioxide film was formed on one surface of a germanium substrate having a p type impurity concentration of $5 \times 10^{16}$ atoms $cm^{-3}$, a hole of about 20 microns in diameter was provided in the silicon dioxide film to expose a portion of said substrate surface, and thereafter antimony was diffused in both surfaces of said substrate to form a planar type p-n junction in said portion and a p-n junction over all of the opposite surface of said substrate. Then, said substrate having two p-n junctions forming the oscillating element was cut out in the size of about 200 microns square, including said planar p-n junction structure and was mounted in a cavity resonator. This microwave generating device, when an avalanche current of 35mA was applied to the first p-n junction 1 and a zero bias was provided to the second p-n junction 2, exhibited output oscillation frequency of 10.5GHz, with a power of 10 milliwatts. When a current equal to the above was supplied to the first p-n junction 1 and a reverse bias above 1V was applied to the second p-n junction, the oscillation frequency of the generating device became about 0.2GHz higher than in the case of the zero biased second p-n junction.

Figure 3:
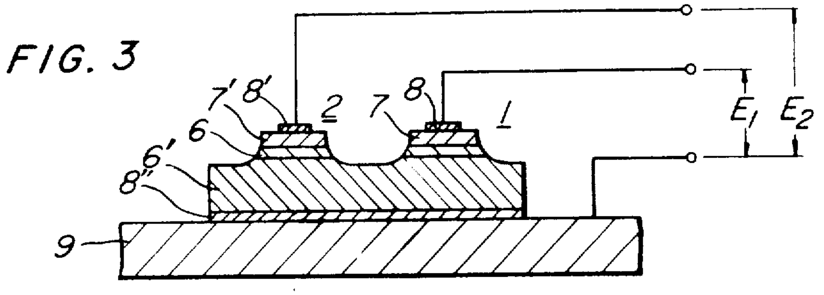

FIG. 3 shows the device according to another embodiment of the present invention wherein two p-n junctions are arranged electrically in parallel relationship with each other. The substrate is comprised of a P-type layer 6 having high resistivity and another P-type layer 6' having low resistivity on which two mesa structures having N-type layers 7 and 7' are formed. As an example of such a device, the present inventors have performed an experiment wherein antimony (Sb) was surface-diffused in a germanium substrate including an epitaxial-growth layer having a P-type impurity concentration of $3 \times 10^{16}$ $cm^{-3}$ positioned on a P-type impurity concentration of $3 \times 10^{18}$ $cm^{-3}$ so as to form an N layer about 3.5 microns in depth, and subsequently diodes of a circular mesa construction each 100 microns in diameter were established on the substrate spaced apart from each other by 500 microns. The experimental result showed that in the case where an avalanche current of 100 mA was supplied to the first p-n junction 1 and zero bias was imparted to the second p-n junction 2, the output oscillation frequency was 7.5 GHz with a power of 80 milliwatts, and that in the case where a current equal to the above was supplied to the first p-n junction 1 and a reverse bias of 1 V or 2 V was applied to the second p-n junction 2, then the oscillation frequency became 2.5 MHz or 4.5 MHz higher than in the case of the zero biased second p-n junction respectively.

It is to be understood that no limitation is laid on the type, configuration and area of each junction. For example, as the second junction, use may be made of a Schottky barrier type or MIS type junction.

With the microwave generating device of the present invention, frequency modulation can be achieved by applying a predetermined reverse electric field $E_1$ to the first p-n junction 1 to cause an avalanche current to flow therethrough, and supplying a modulating signal to the second p-n junction in superimposition upon a reverse bias of $E_2$.

Figure 4:
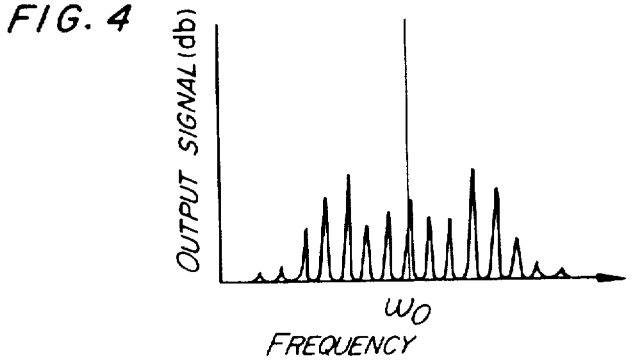
FIG. 4 is a view showing the characteristics of a device embodying the present invention.

According to the inventors' experience with the element of the type in which two diodes having the aforementioned circular mesa construction are disposed in juxtaposing relationship to each other, it is possible to obtain such modulation characteristics as shown in FIG. 4, by supplying an avalanche current of 50 mA to the first p-n junction 1 and a modulating signal of 1 V peak-to-peak at 200 KHz to the second p-n junction 2 together with a reverse bias of −2 V.

As described above, in the microwave generating device of the present invention, at least two p-n junctions are formed on a single semiconductor substrate, one of the p-n junctions is made to operate as an avalanche diode while being maintained at a predetermined negative resistance value, and the other p-n junction has the reactance thereof electrically varied, so that the output oscillation frequency can be controlled. Thus, microwave tuning and modulating operation can be performed without superimposing any signal upon the avalanche current. With such an arrangement, therefore, the avalanche current can be sufficiently controlled so that it is possible to prevent the oscillator element from being destroyed by heat.

Furthermore, the device of this invention has the advantages that the mechanisms for tuning, modulation, automatic frequency control and so forth can be greatly simplified.

What is claimed is:

1. A microwave generator device having a solid state oscillation element and a varactor comprising:
- a resonant circuit consisting of a microwave transmission structure,
- a semiconductor body of one conductivity type located within said structure,
- first and second p-n junctions integrally formed on said semiconductor body in proximity with each other,
- first and second ohmic contact electrodes provided in separate regions of a same conductivity type different from that of said body, said regions forming said first and second p-n junctions together with the region of said body, respectively,
- a third ohmic contact electrode provided on said body which is common with said two p-n junctions,
- a first power source connected between said first and third electrodes for applying to said first p-n junction reverse bias beyond the breakdown voltage thereof to cause a microwave oscillation, and
- a second power source connected between said second and third electrodes for applying a variable bias to said second p-n junction to function as the varactor whereby the internal impedance of said first p-n junction is varied in response to variations in the reactance of said second p-n junction, an output signal variable in frequency obtained by the adjustment of said first and second power sources being derived from said resonant circuit.

2. The microwave generator device according to claim 1, in which said first and second p-n junctions are formed on mutually opposing surfaces of said semiconductor body axially of each other.

3. The microwave generator device according to claim 1, in which said first and second p-n junctions are of a mesa type construction on the same surface of said body.

4. The microwave generator device according to claim 1, in which said first and second p-n junctions are located on a plane of said body concentrically to each other.

5. THe microwave generator device according to claim 3, in which said first and second mesa type p-n junctions are juxtaposed on a single axis.

6. The microwave generator device according to claim 3, in which said first and second mesa type p-n junctions are juxtaposed concentrically of each other.

7. The microwave generator device according to claim 1, in which a microwave frequency generated by said first p-n junction is modulated by application of a zero or reverse bias with a modulating signal to said second p-n junction.

8. The microwave generator device according to claim 1, in which said first and second p-n junctions and said all electrodes are formed with said body in an integrated circuit structure.

9. A microwave generator device having a solid state oscillation element and a variable reactance element comprising:
- a resonant circuit consisting of a microwave transmission structure,
- a semiconductor monolithic body of one conductivity type located within said transmission structure,
- at least one p-n junction formed on said body adapted to serve as an avalanche diode,
- a Schottky barrier structure formed on said body serving as the variable reactance element, which structure is electrically connected to said p-n junction,
- a first power source for applying to said p-n junction a reverse bias beyond the breakdown voltage thereof to generate a microwave frequency signal,
- a second power source for applying a bias variable with a modulating signal to said Schottky barrier type junction to provide the variation of reactance for controlling said generated microwave signal,
- an output signal obtained in accordance with the biasing by said first and second power sources being derived from said resonant circuit.

10. A microwave generator device having a solid state oscillation element and a variable reactance element comprising:
- a resonant circuit consisting of a microwave transmission structure,
- a semiconductor monolithic body of one conductivity type located within said transmission structure,
- at least one p-n junction formed on said body adapted to service as an avalanche diode,
- a sandwich structure of a metal-insulator-semiconductor formed on said body serving as the variable reactance element, which structure is electrically connected with said p-n junction, a first power source for applying to said p-n junction a reverse bias beyond the breakdown voltage thereof to generate a microwave frequency signal, a second power source for applying a bias variable with a modulating signal to said sandwich structure to provide the variation of reactance for controlling said generated microwave signal, an output signal obtained in accordance with the biasing by said first and second power sources being obtained from said resonant circuit.

* * * * *